United States Patent
Marecaux et al.

(10) Patent No.: US 10,999,547 B2
(45) Date of Patent: May 4, 2021

(54) MATRIX-ARRAY DETECTOR WITH CONTROLLED-IMPEDANCE ROW CONDUCTORS

(71) Applicant: TRIXELL, Moirans (FR)

(72) Inventors: Simon Marecaux, Moirans (FR); David Blanchon, Moirans (FR); Martin Siaud, Moirans (FR)

(73) Assignee: TRIXELL, Moirans (FR)

( * ) Notice: Subject to any disclaimer, the term of this patent is extended or adjusted under 35 U.S.C. 154(b) by 20 days.

(21) Appl. No.: 16/717,995

(22) Filed: Dec. 17, 2019

(65) Prior Publication Data
US 2020/0204754 A1 Jun. 25, 2020

(30) Foreign Application Priority Data

Dec. 21, 2018 (FR) ...................................... 1873891

(51) Int. Cl.
*H04N 5/3745* (2011.01)
*H01L 27/146* (2006.01)
*H04N 5/376* (2011.01)
*H04N 5/345* (2011.01)

(52) U.S. Cl.
CPC ..... *H04N 5/3745* (2013.01); *H01L 27/14603* (2013.01); *H01L 27/14643* (2013.01); *H04N 5/3765* (2013.01); *H01L 27/14692* (2013.01); *H04N 5/3452* (2013.01)

(58) Field of Classification Search
CPC .. H04N 5/3745; H04N 5/3765; H04N 5/3452; H04N 5/32; H04N 5/378; H04N 5/376; H01L 27/14603; H01L 27/14643; H01L 27/14692
See application file for complete search history.

(56) References Cited

U.S. PATENT DOCUMENTS

| | | | |
|---|---|---|---|
| 5,619,223 A * | 4/1997 | Lee | G09G 3/3677 345/100 |
| 10,873,716 B2 * | 12/2020 | Xu | H04N 5/3745 |
| 2006/0001918 A1 | 1/2006 | Okano et al. | |
| 2007/0146514 A1 | 6/2007 | Maeda et al. | |
| 2012/0086826 A1 | 4/2012 | Masuyama et al. | |

FOREIGN PATENT DOCUMENTS

WO 2012/152836 A1 11/2012

\* cited by examiner

*Primary Examiner* — Seung C Sohn
(74) *Attorney, Agent, or Firm* — BakerHostetler (57) ABSTRACT

A matrix-array detector includes an array of pixels that are sensitive to a physical effect and arranged in a matrix along rows and down columns, each pixel generating a signal according to the physical effect; row conductors, each allowing the pixels of one row to be driven; driver modules delivering selection signals to the row conductors, the driver modules being configured to deliver signals according to either of two levels, one being a high level allowing one of the rows of pixels to be selected and the other being a low level not allowing it to be selected. The detector further comprises impedance modules that are connected to each of the row conductors and configured to decrease the impedance of each row conductor and to keep the impedance of each row conductor low in a phase of reading the array of pixels as long as the corresponding selection signal is at the low level, the impedance modules being separate from the driver modules.

6 Claims, 5 Drawing Sheets

MATRIX-ARRAY DETECTOR WITH CONTROLLED-IMPEDANCE ROW CONDUCTORS

CROSS-REFERENCE TO RELATED APPLICATIONS

This application claims priority to foreign French patent application No. FR 1873891, filed on Dec. 21, 2018, the disclosure of which is incorporated by reference in its entirety.

FIELD OF THE INVENTION

The present invention relates to a matrix-array detector. The invention is of use in producing visible images but is not limited to that field. It is for example possible to produce pressure or temperature maps or two-dimensional representations of chemical or electrical potentials. These maps or representations form images of physical quantities. The invention applies in particular to active matrix-array detectors used for example for detection purposes in imaging devices employing ionizing radiation, for example x-rays, such as TFT plates, where TFT stands for "thin-film transistor".

BACKGROUND

In a matrix-array detector, a pixel represents the basic sensitive element of the detector. Each pixel converts a physical effect to which it is subjected into an electrical signal. The electrical signals from the various pixels are collected in a matrix-array read phase then digitized so as to be able to be processed and stored to form an image. The pixels are formed by a zone sensitive to the physical effect and deliver a current of electric charges, for example. The physical effect may be electromagnetic radiation delivering a stream of photons and, consequently, the invention will be explained by means of this type of radiation and the charge current is dependent on the stream of photons received by the sensitive zone. Generalizing to any matrix-array detector is straightforward.

A matrix-array image detector comprises row conductors, each connecting the pixels of one and the same row, and column conductors, each connecting the pixels of one and the same column. The column conductors are connected to converter circuits that are generally arranged at the edge of the matrix array, which may be referred to as the "foot of the column".

Each pixel generally comprises a photosensitive element, or photodetector, which may for example be a photodiode, a photoresistor or a phototransistor. There are photosensitive matrix arrays of large size which may have several millions of pixels arranged in rows and columns. Each pixel further consists of an electronic circuit consisting, for example, of switches, capacitors and resistors, downstream of which there is an actuator. The assembly consisting of the photosensitive element and the electronic circuit allows electric charges to be generated and collected. The electronic circuit generally allows the charge collected in each pixel to be reset after a charge transfer. The role of the actuator is to transfer or copy the charges collected by the circuit into a column conductor. This transfer is performed when the actuator receives the instruction to do so from a row conductor. The output of the actuator corresponds to the output of the pixel. The terms "row conductor" and "column conductor" are completely arbitrary. It is of course possible to switch these terms.

In this type of detector, a pixel operates in two phases: an image capture phase, in which the electronic circuit of the pixel accumulates the electric charges generated by the photosensitive element, and a read phase, in which the collected charges are transferred or copied into the column conductor by the actuator.

In the read phase, a read instruction is transmitted to all of the actuators of one and the same row of the matrix array by a row conductor. Each of the pixels in this row is read by transferring its electrical information, e.g. charge, voltage, current, frequency, etc. to the column conductor with which it is associated.

For one image frame, the rows of pixels may be selected sequentially, one after the other, in a direction of scanning the rows of the matrix array over a row selection time corresponding to a fraction of the frame duration, allowing appropriate signals, for example voltages, to be applied to the pixels of the row in question. Thus, selecting a row corresponds to applying, for a corresponding row selection time, a high-level signal controlling the on state of the switching devices of the corresponding row of pixels. Outside of the row selection time, the switching devices are kept in an off state by applying a suitable low-level signal. For example, when the switching devices are transistors, and the signals to be applied are then voltages, it is common practice to use VGon to denote the voltage corresponding to the high level and therefore to the on state of the switching transistor, and VGoff to denote the voltage corresponding to the low level and the off state of the switching transistor.

The rows can be controlled by control circuits comprising one or more shift registers in series, each of the shift registers comprising a plurality of cascaded stages, each stage being suitable for switching the high and low levels of the signal applied to the actuators for the pixels of a corresponding row of the matrix array according to the sequencing of the row selection operation, for example vertical scanning. The control circuits may be implemented in integrated circuits, one and the same integrated circuit being able, for example, to have a plurality of control circuits for a plurality of rows in the matrix array. The integrated circuits may, for example, be external to the matrix array, and be connected thereto by wired means, for example by flexible ribbon cables. The control circuits may also be installed on the plate bearing the pixels as described in patent application WO 2012/152836 filed by the applicant.

This makes it possible to decrease the number of signals applied to the plate and hence the size and number of flexible connectors used to connect the plate to its surrounding electronics. This integrated control circuit architecture constitutes an appreciable simplification of the detector architecture by decreasing the number of components and simplifying the manufacturing process. However, the circuit described in patent application WO 2012/152836 has the drawback of leaving all unselected rows in a "high-impedance" state. Specifically, during the matrix-array read cycle, the control circuits successively apply the voltages VGon and VGoff to the rows then leave these rows at the level VGoff without ensuring that this potential is maintained or stabilized in the event of external interference. Changes in the voltages of the adjacent rows and columns may thus result in crosstalk effects through capacitive coupling between the rows left at the level VGoff in the high-impedance state and neighbouring elements, the potential of which varies over the read cycle. Incorporating the control circuits on the plate bearing the pixels tends to increase crosstalk and decrease the image quality from the detector.

The "high-impedance" state of the row conductors also leads to interference if a row is broken. More specifically, in matrix arrays of large size, it is possible to accept certain manufacturing defects resulting in a few rows of pixels not functioning. One row may be broken for example when one of the control circuits is not functional. It is possible to correct the image by extrapolating from adjacent, unbroken rows. However, the broken row may interfere with the adjacent rows. This interference is related to the fact that a portion of the row is not addressed and remains permanently in the high-impedance state throughout the read phase.

SUMMARY OF THE INVENTION

The invention aims to overcome all or some of the problems mentioned above by providing a matrix-array detector that prevents row conductors from remaining in the high-impedance state.

To this end, one subject of the invention is a matrix-array detector comprising:

- an array of pixels that are sensitive to a physical effect and arranged in a matrix along rows and down columns, each pixel generating a signal according to the physical effect;
- row conductors, each allowing the pixels of one row to be driven;
- driver modules delivering selection signals to the row conductors, the driver modules being configured to deliver signals according to either of two levels, one being a high level allowing one of the rows of pixels to be selected and the other being a low level not allowing it to be selected.

According to the invention, the device further comprises impedance modules that are connected to each of the row conductors and configured to decrease the impedance of each row conductor and to keep the impedance of each row conductor low in a phase of reading the array of pixels as long as the corresponding selection signal is at the low level, the impedance modules being separate from the driver modules.

Each row conductor comprises two ends. The driver modules are connected to the row conductors at a first of the ends and the impedance modules are advantageously connected to each of the row conductors at a second of the ends.

The array of pixels, the driver modules and the impedance modules are advantageously formed on the same substrate.

The impedance modules advantageously each comprise a transistor that is able to connect the corresponding row to a voltage source corresponding to the low level of the selection signal when the row is not selected, thus decreasing the impedance of the row through the transistor.

The array of pixels, the driver modules and the impedance modules advantageously comprise thin-film transistors.

The detector advantageously comprises two impedance modules per row conductor, the two impedance modules being able to be used in alternation.

BRIEF DESCRIPTION OF THE DRAWINGS

The invention will be better understood and further advantages will become apparent upon reading the detailed description of one embodiment provided by way of example, which description is illustrated by the attached drawing, in which.

For the sake of clarity, the same elements will bear the same references in the various figures.

DETAILED DESCRIPTION

The following description is provided with reference to a matrix-array detector comprising a plurality of elementary electronic circuits referred to as pixels, each comprising an element that is sensitive to a physical quantity. The elementary electronic circuits are, in the example described, pixels that are sensitive to light radiation. It is clear that the invention may be employed for other detectors sensitive to any form of physical quantity, allowing for example pressure or temperature maps to be produced.

Figure 1:
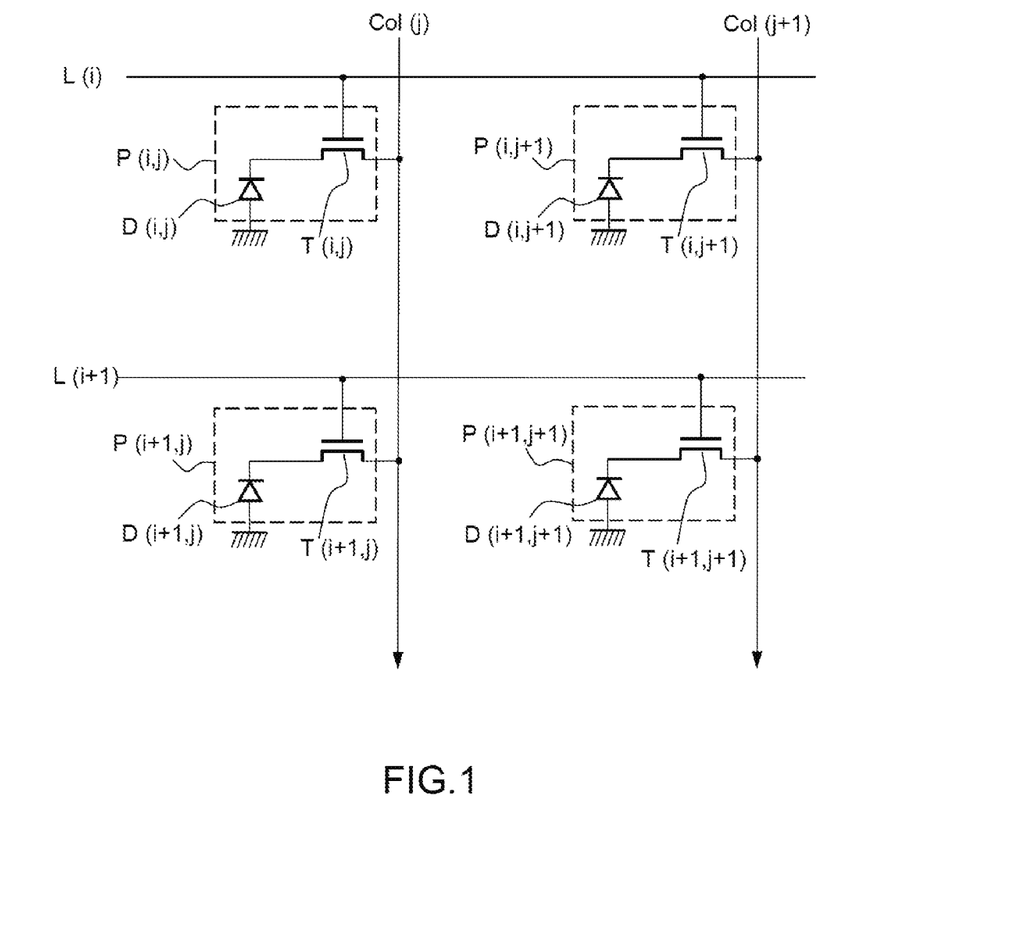
FIG. 1 shows an exemplary matrix-array of pixels that may be employed in a detector according to the invention.

FIG. 1 schematically shows the detection zone 10 of a matrix-array detector. This zone comprises a matrix of two rows and two columns to facilitate understanding. Four pixels P are formed, each at the intersection of one row and one column. Of course, actual matrix arrays are generally much larger and feature a large number of rows and columns. The matrix array of pixels belongs to a matrix-array detector 12 allowing digitized images to be produced.

Each pixel P comprises a photosensitive zone, represented here by a photodiode D, and an electronic processing circuit formed, in the example of FIG. 1, by a single transistor T. The references for the components D and T are followed by two coordinates specifying the rank of the row, i and i+1, respectively, and that of the column, j and j+1, respectively. The pixels shown are also known as 1T pixels since they each possess one transistor, the function of which will be described further below.

In general, it is common practice to produce matrix arrays of pixels comprising thin-film field-effect transistors, known as TFTs for "thin-film transistors". TFTs may be based on metal oxides such as for example transistors based on amorphous or crystalline indium, gallium and zinc oxide, which are known by the abbreviation IGZO. Other families of TFTs may be employed such as for example organic TFTs, amorphous silicon TFTs or polycrystalline silicon TFTs. In this last type of TFT, some have been synthesized at low temperature. They are known by the acronym LTPS for "low-temperature polycrystalline silicon".

The invention is not limited to this type of transistor. It may for example be employed for matrix arrays comprising CMOS transistors, where CMOS stands for "complementary metal-oxide-semiconductor".

The pixels P of one and the same column are connected to a column conductor Col. This conductor allows information from the pixels connected thereto to be collected. The pixels P of one and the same row are connected to a row conductor L carrying a signal VG allowing the corresponding row of pixels to be controlled.

In an image capture phase, which takes place after a reset operation, the illumination received by the photodiode D decreases the potential on its cathode. This image capture phase is followed by a read phase in which the potential of the photodiode D is read. To do this, the transistor T is turned on, which therefore acts as a switch controlled by the control signal VG applied to its gate.

The column conductor Col is used to collect information from a pixel in the corresponding column when it is selected by the signal VG.

It is possible to implement the invention in a detector in which the pixels are simpler, in particular by replacing the transistor T with a simple diode which is turned on by the signal VG. It is also possible to implement the invention in a detector in which the pixels comprise a plurality of transistors. In particular, it is known practice to employee 3T pixels comprising, in addition to the read transistor described above, a reset transistor for the photodiode and a follower transistor. In this type of 3T pixel, a second row conductor carries a reset signal allowing the reset transistor to be controlled.

Figure 2:
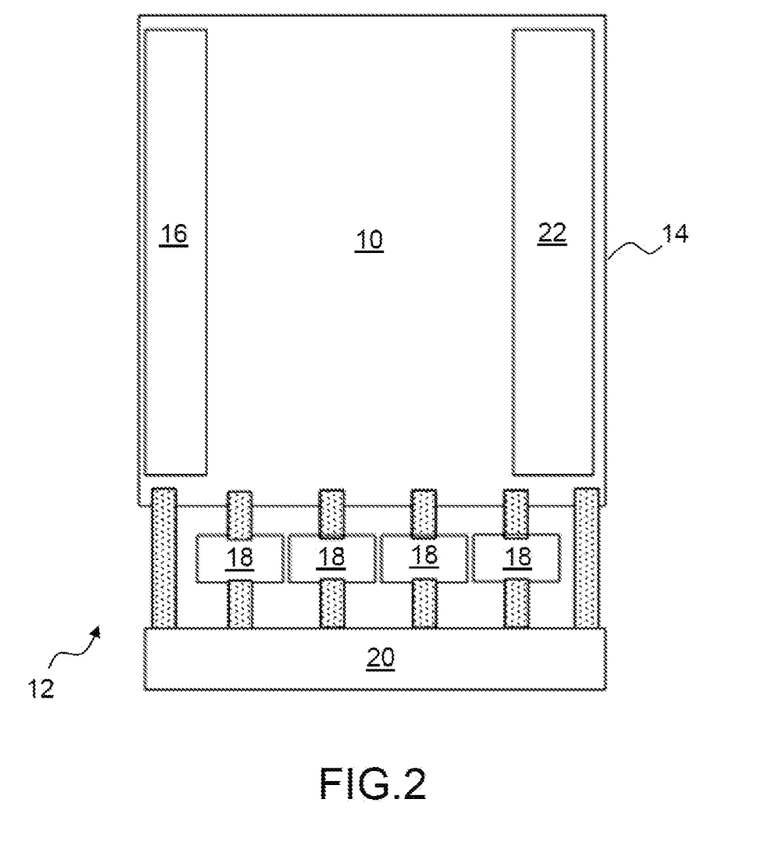
FIG. 2 shows an exemplary detector according to the invention.

FIG. 2 schematically shows the overall detector 12. The detector 12 comprises a plate 14 forming the substrate on which the components of the detection zone 10 are produced. Driver modules 16 delivering control signals to all of the row conductors L are also arranged on this same plate 14. The driver modules 16 comprise example shift registers allowing the control signals to be generated. Alternatively, the driver modules 16 may be produced on a substrate distinct from the plate 14. However, producing the driver modules 16 on the same substrate as the pixel P makes it possible to limit the connections connecting the plate 14 to its surroundings.

The detector 12 comprises read circuits 18 that are connected to the column conductors Col. The read circuits 18 are generally produced on substrates distinct from the plate 14. The read circuits 18 are connected to the plate 14 by means of ribbon cables.

The detector 12 comprises a circuit 20 allowing the driver modules 16 to be driven and allowing the signals from the read circuits 18 to be retrieved, in particular in order to multiplex them.

According to the invention, the detector 12 comprises impedance modules 22 that are connected to each of the row conductors L. Like for the driver modules 16, the impedance modules 22 are advantageously produced on the plate 14 so as to limit the external connections to the plate 14.

The invention is described with reference to a matrix array of 1T pixels having just one conductor L per pixel row. It is also possible to implement the invention for matrix arrays in particular formed of 3T pixels, and having a plurality of control conductors per row of pixels. In this case, impedance modules could be associated with all of the row conductors.

To drive the read transistors T, the driver modules 16 generate binary signals including a high level allowing a pixel row to be read and the low level not allowing the row to be read. The terms "high level" and "low level" are completely arbitrary and used only to differentiate the voltages applied to the row conductor. These terms may of course be switched. The driver modules 16 employ components such as transistors, and when the high level is applied to the row L it exhibits lower impedance than when the low level is applied to the row L. As mentioned above, the high-level impedance may result in local variations in potential on the row. These variations may be the source of interference in the image from the detector 12.

The impedance modules 22 are configured to decrease the impedance of the row conductors L during the transmission of the low-level signals. More specifically, for each row i, for as long as the corresponding driver module 16 is transmitting a row selection signal at the low level, the impedance module 22 keeps the corresponding row at low impedance. The impedance modules 22 are separate from the driver modules.

The impedance modules 22 are advantageously arranged on the opposite side with respect to that occupied by the driver modules 16. In other words, each row conductor L has two ends. The driver modules 16 are connected to the row conductors L at a first of the ends and the impedance modules 22 are connected to each of the row conductors at a second of the ends.

Figure 3:
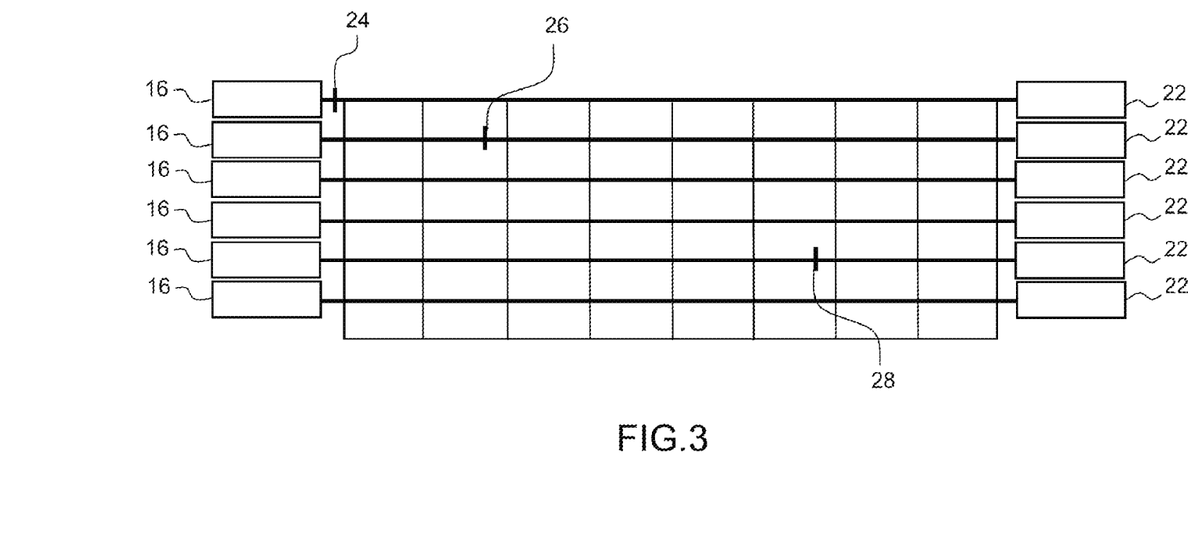
FIG. 3 illustrates one advantage of the invention when row conductors of the detector are broken.

FIG. 3 illustrates this arrangement and its advantages. More specifically, FIG. 3 shows a detector comprising six rows and eight columns of pixels P. The driver modules 16 are located in the left-hand portion of the detection zone 10 in which the pixels P are arranged and the impedance modules 22 are located in the right-hand portion. During the manufacture or use of the detector, row L breaks may appear.

These breaks may be unintentional, in the case of a manufacturing defect, or intentional when the break is used to repair a defect or to minimize the impact thereof on the overall quality of the image from the detector 12. In FIG. 3, three breaks are shown. A first break 24 appears on the first row between a driver module 16 and the detection zone 10. Breaks 26 and 28 appear inside the detection zone 10.

In the absence of an impedance module 22, the broken row portion opposite the driver module 16 is electrically floating and its potential is not fixed. The potential of this floating portion may in turn interfere with the potential of the adjacent rows, columns and pixels through capacitive coupling and hence negatively affect the image quality from the detector. With the impedance modules 22 arranged on the side opposite the driver modules 16, the row portions that are isolated from the driver modules 16 are no longer floating and their potential is fixed at a value determined by the impedance modules 22, for example a value corresponding to an absence of row selection. This results in an improvement to the image quality from the detector through the reduction of artefacts due to the risk of coupling between these floating portions and neighbouring elements such as rows, columns of pixels. Consequently, the pixels in a broken row are either driven by the driver module 16 associated with the row conductor or set to low impedance by the impedance module 22 which is also associated with the row regardless of the location of the break along the row.

FIG. 2 shows the implementation of the invention in a detector comprising a plate 14 on which, in addition to the pixels, the driver modules 16 and the impedance modules 22 are incorporated. Such a level of integration dictates the use of the same transistor technology both for the pixels P and for the driver 16 and impedance 22 modules.

It is also possible to implement the invention even if the driver modules 16 are not incorporated on the plate 14. In this variant, it is possible to produce driver modules 16 including the low-impedance holding function for the two signal levels VGon et VGoff using different transistor technologies. This variant is of interest for stabilizing the impedance of broken rows, which commonly occurs in detectors featuring a large number of pixels.

In FIG. 2, the impedance modules 22 are arranged on the opposite side with respect to that occupied by the driver modules 16. Alternatively, the impedance modules 22 may be located in the vicinity of the driver modules 16, i.e. on the same side of the detection zone 10, and more specifically between driver modules 16 and the detection zone 10. This arrangement has the advantage of grouping all of the driver and impedance components together on one and the same edge of the detector 12. The advantage related to holding the impedance of broken rows is lost. However for certain applications, such as mammography or nondestructive testing, it may be advantageous to position the last column of pixels, the one furthest away from the driver module 16, as close to the outer edge of the detector 12 is possible.

Figure 4:
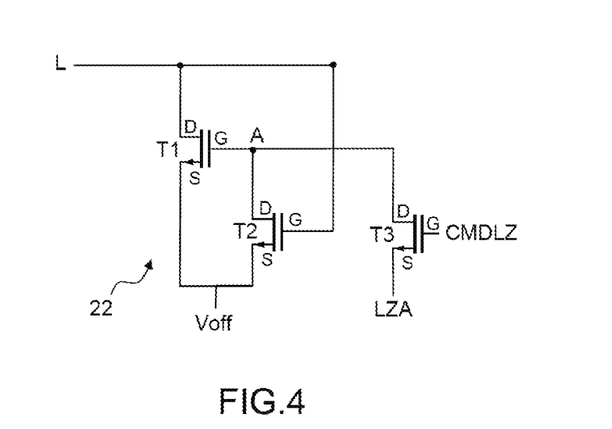
FIG. 4 shows an exemplary impedance module that may be employed in a detector according to the invention.

FIG. 4 shows an example of an impedance module 22 formed on the basis of three thin-film transistors T1, T2 and T3. The drain of the transistor T1 is connected to the row L and its source is connected to a voltage source Voff corresponding to the low level VGoff of the signal VG.

In the read phase of the detector, the driver module 16 applies the signal VG to the row L either at the high level VGon when the row L is selected or at the low level VGoff when the row L is not selected. The driver module 16, in particular when it is formed on the plate 14, may also employ thin-film transistors for applying the signal VG. The high level VGon is applied through a transistor placing the row L at low impedance while the low level VGoff is applied by turning this same transistor off, placing the row L at high impedance.

The impedance module 22 connects the row L to the voltage Voff when the row L is not selected, thereby lowering the impedance of the row conductor L through the transistor T1.

The transistors T2 and T3 allow the transistor T1 to be driven. The drains of the transistors T2 and T3 are connected to the gate of the transistor T1 forming a node A inside the impedance module 22. The row L is connected to the gate of the transistor T2. The source of the transistor T2 is connected to the voltage source Voff. The source of the transistor T3 is connected to a command LZA allowing the level of the node A to be set. The gate of the transistor T3 is connected to a command CMDLZ allowing the node to A to be connected to the command LZA.

Figure 5:
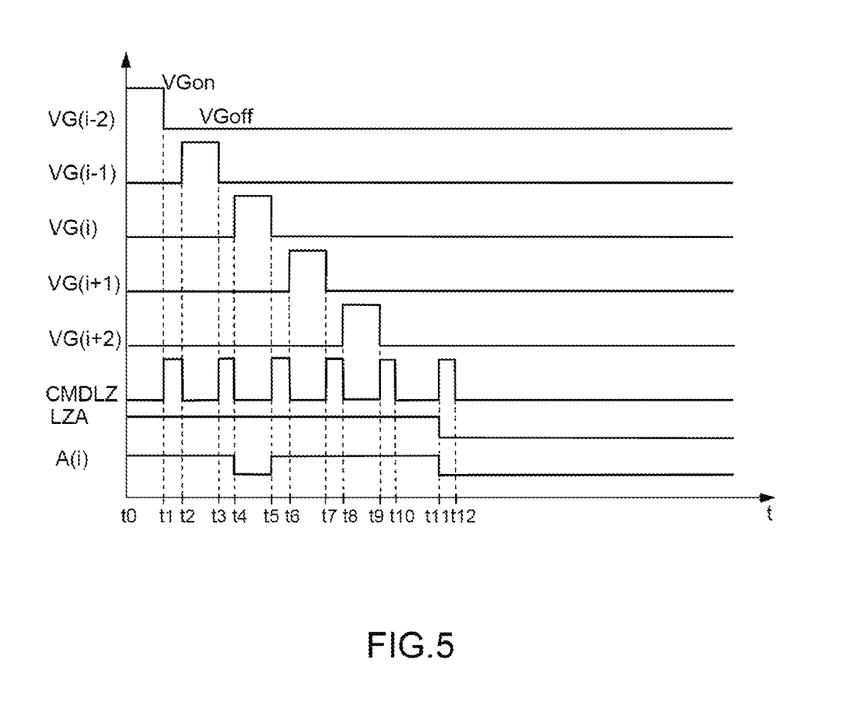
FIG. 5 illustrates, in the form of a timing diagram, the operation of the impedance module of FIG. 4.

FIG. 5 illustrates, in the form of a timing diagram, the operation of the impedance module 22. The row selection signals VG for five consecutive rows, from i−2 to i+2, are shown. The signal VG(i−2) is at the high level VGon between times t0 and t1. After time t1, the signal VG(i−2) is at the low level VGoff. The following rows are then selected one after the other in the same way. The signal VG(i−1) is at the high level VGon between times t2 and t3. The signal VG(i) is at the high level VGon between times t4 and t5. The signal VG(i+1) is at the high level VGon between times t6 and t7. Lastly, the signal VG(i+2) is at the high level VGon between times t8 and t9. The signal CMDLZ transitions to the high level for a short duration before the selection of each row L, in particular between times t3 and t4 for the row i. Throughout the read phase, i.e. between times t0 and t11, the signal LZA is at the high level. Out of the read phase, after time t11 in the example shown, the signal LZA is at the low level.

When the row i is not selected, the node A remains in the high state, the transistor T1 is on and the impedance module 22 holds the row conductor L(i) at low impedance, which remains at the voltage Voff.

When the signal CMDLZ transitions to the high level before the selection of the row i, between times t3 and t4, the transistor T3 turns off, thereby placing the node A at high impedance.

When the row i is selected, the voltage VGon is applied to the row conductor L(i) which turns the transistor T2 on, causing the node A to drop to the low level. The transistor T1 turns off between times t4 and t5. The impedance module 22 no longer modifies the impedance of the row conductor L(i).

The signal CMDLZ may be common to all of the rows and rise to the high level before each row selection. The turning off of the transistor T1 of a row takes effect only when the conductor of the row in question receives the signal VG in the high state.

Once the read phase has ended, after time t11, in the acquisition phase of the detector, the signal LZA is held at the low level. A last transition of the signal CMDLZ through the high level, between times t11 and t12, allows the node A at the low level to be placed at high impedance, which allows the three transistors T1, T2 and T3 to be placed at the voltage Voff.

As seen above, it is advantageous to produce the assembly 10 of pixels P, the driver modules 16 and the impedance modules 22 on the same plate 14 so as to limit the connections from the plate 14 to its surroundings. In the exemplary impedance module 22 of FIG. 4, one module is required per row of pixels. All of the impedance modules 22 may be driven by the circuit 20. Therefore, to drive all of the impedance modules 22, only the three signals Voff, CMDLZ and LZA have to pass through the circuit 20 the plate 14, which simplifies the connections from the plate 14.

The pixels and the two types of modules 16 and 22 are advantageously produced on one and the same plate 14 by using just one transistor technology, in particular TFTs (thin-film transistors). TFTs produced on a glass plate find it difficult to remain in the on state for a long time. This leads to their threshold voltage drifting and hence to the detector ageing prematurely. For this reason, out of the read phase, the transistors are placed at the voltage Voff. When using a detector for x-ray imaging, the phase of reading all of the pixels of the detector takes up about 1%, or even less, of the service life of the detector. This ratio may be enough to avoid premature ageing of the detector due to switching of the TFTs.

Figure 6:
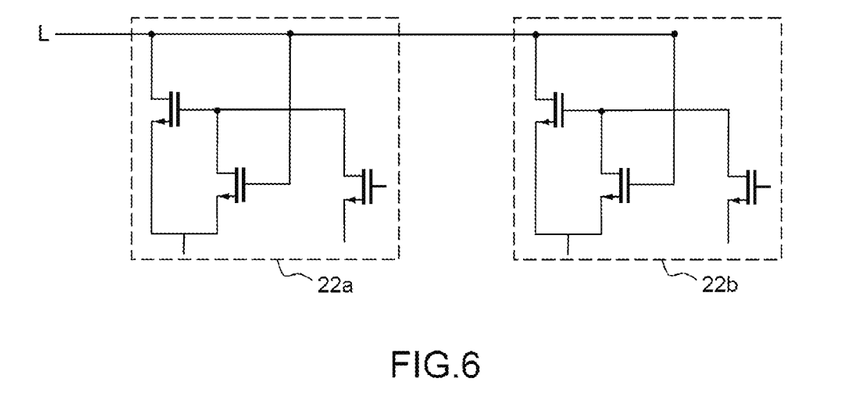
FIG. 6 shows a variant impedance module that may be employed in a detector according to the invention.

It is possible to decrease the rate of use of the TFTs still further by doubling the number of impedance modules 22. FIG. 6 shows an example in which two impedance modules 22a and 20b are connected to one and the same row conductor L. The two modules 22a and 22b are used alternately. For example, the module 22a is used in the reading of one image and the module 22b in the reading of the next image. This embodiment allows the times for which the transistors are in the on state to be divided by two. The service life of the detector is thus increased correspondingly.

The impedance modules 22 shown in FIGS. 4 and 6 are well suited for being produced on the same TFT plate as the detection zone 10. It is of course possible to implement the invention using other transistor technologies or to produce the detection zone 10 and the impedance modules 22 on different plates.

The impedance modules 22 may for example be produced using AND logic gates receiving the signal CMDLZ, the signal VG and possibly the signal LZA. The output of the impedance modules 22 controlling the termination of the operation of placing the corresponding row at low impedance is obtained when the signal VG is at the high level and when the signal CMDLZ is at the low level. Other ways in which the impedance modules 22 may be produced, such as for example by employing shift registers, are of course possible.

The invention claimed is:

1. A matrix-array detector comprising:
an array of pixels (P) that are sensitive to a physical effect and arranged in a matrix along rows and down columns, each pixel (P) generating a signal according to the physical effect;
row conductors (L), each allowing the pixels (P) of one row to be driven;
driver modules delivering selection signals (VG) to the row conductors (L), the driver modules being configured to deliver signals according to either of two levels, one being a high level (VGon) allowing one of the rows of pixels to be selected and the other being a low level (VGoff) not allowing it to be selected;
wherein it further comprises impedance modules that are connected to each of the row conductors (L) and configured to decrease the impedance of each row conductor (L) and to keep the impedance of each row conductor (L) low in a phase of reading the array of pixels (P) as long as the corresponding selection signal (VG) is at the low level (VGoff), the impedance modules being separate from the driver modules.

2. The matrix-array detector according to claim 1, wherein each row conductor (L) comprises two ends, in that the driver modules are connected to the row conductors (L) at a first of the ends and in that the impedance modules are connected to each of the row conductors (L) at a second of the ends.

3. The matrix-array detector according to claim 1, wherein the array of pixels (P), the driver modules and the impedance modules are formed on the same substrate.

4. The matrix-array detector according to claim 1, wherein the impedance modules each comprise a transistor (T1) that is able to connect the corresponding row to a voltage source (Voff) corresponding to the low level (VGoff) of the selection signal when the row (L) is not selected, thus decreasing the impedance of the row (L) through the transistor (T1).

5. The matrix-array detector according to claim 1, wherein the array of pixels (P), the driver modules and the impedance modules comprise thin-film transistors.

6. The detector according to claim 5, wherein it comprises two impedance modules per row conductor (L), the two impedance modules being able to be used in alternation.

* * * * *